United States Patent [19]
Toda

[11] Patent Number: 5,247,186
[45] Date of Patent: Sep. 21, 1993

[54] INTEGRATED OPTICAL DISPLACEMENT SENSOR

[75] Inventor: Akitoshi Toda, Tokyo, Japan

[73] Assignee: Olympus Optical Co., Ltd., Tokyo, Japan

[21] Appl. No.: 875,348

[22] Filed: Apr. 29, 1992

[30] Foreign Application Priority Data

May 14, 1991 [JP] Japan .................................. 3-109103

[51] Int. Cl.⁵ ............................................ G01N 21/86
[52] U.S. Cl. .................................... 250/561; 250/307
[58] Field of Search ............... 250/561, 216, 306, 307; 356/373, 375, 376, 1, 4; 359/163; 385/14; 73/761, 655, 705, 723, 826, 800; 357/30 L, 30 M, 30 G, 19

[56] References Cited

U.S. PATENT DOCUMENTS

| | | |
|---|---|---|
| 3,842,263 | 10/1974 | Kornrumpf et al. .................. 357/19 |
| 4,724,318 | 2/1988 | Binnig . |
| 5,025,658 | 6/1991 | Elings et al. . |
| 5,105,239 | 4/1992 | Uchino et al. ..................... 357/30 L |
| 5,130,531 | 7/1992 | Ito et al. .............................. 250/216 |

*Primary Examiner*—David C. Nelms
*Assistant Examiner*—K. Shami
*Attorney, Agent, or Firm*—Frishauf, Holtz, Goodman & Woodward

[57] ABSTRACT

An integrated optical displacement sensor for measuring displacement of a sample, comprises a semiconductor substrate, laser for generating a laser beam, two micro-lens for focusing the laser beam generated from the laser on a surface of the sample, and an optical detector for detecting a reflection light reflected on the surface of the sample and for obtaining an output signal which varies in accordance with displacement of the sample. The laser, lens and detector are integrated with the substrate.

27 Claims, 9 Drawing Sheets

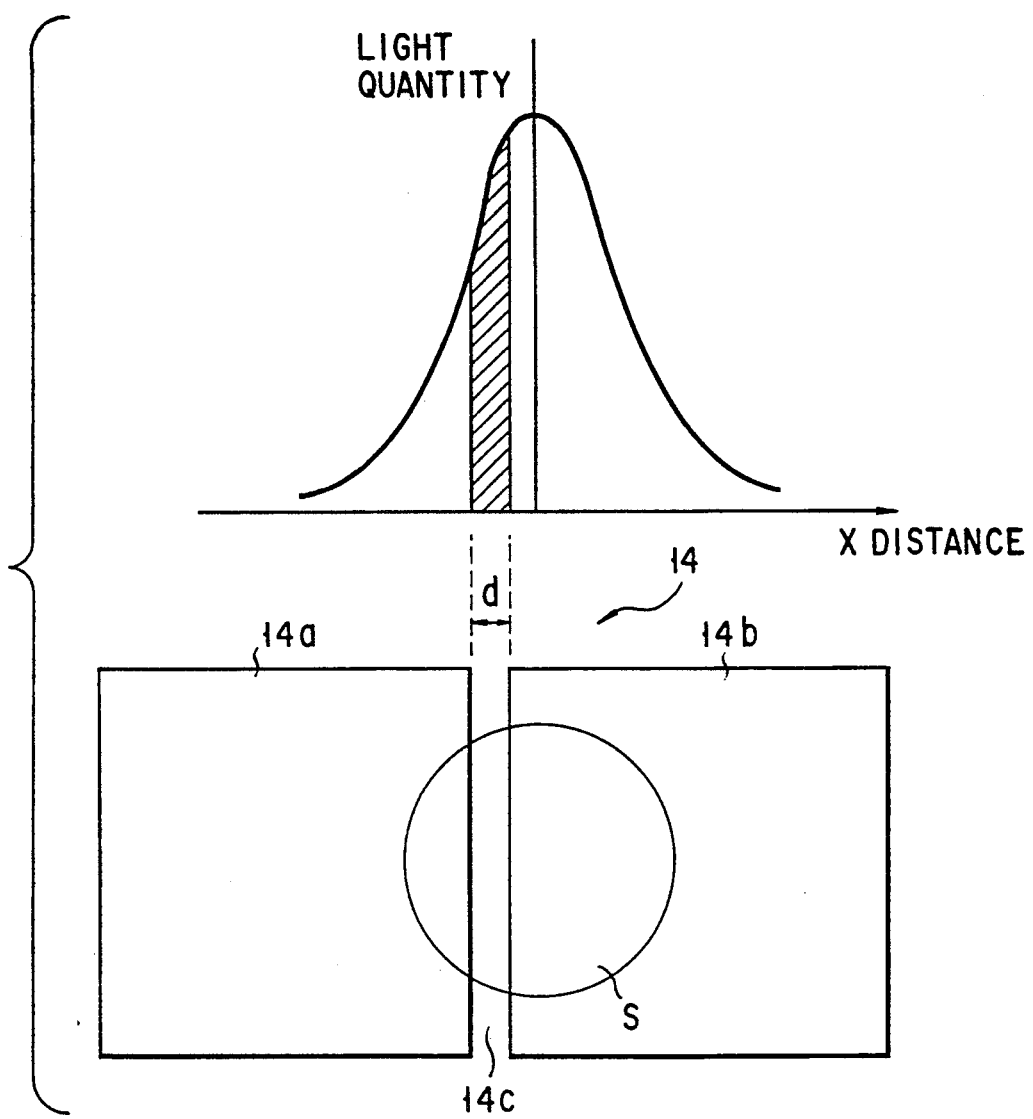
F I G. 2

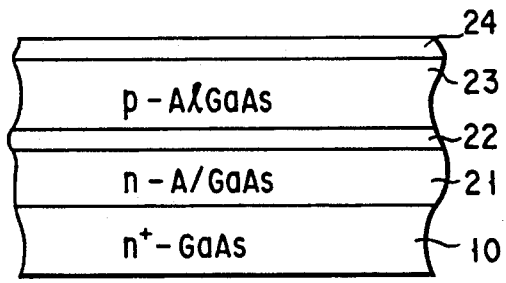
F I G. 4A
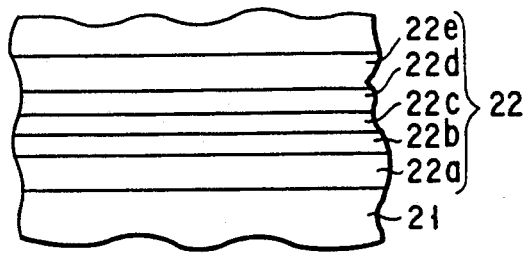
F I G. 4B
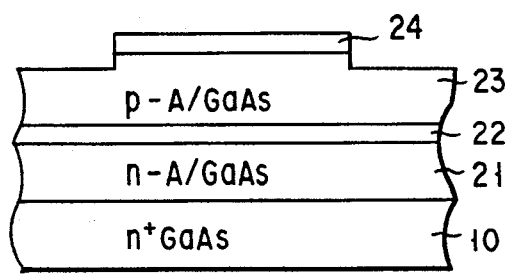
F I G. 4C
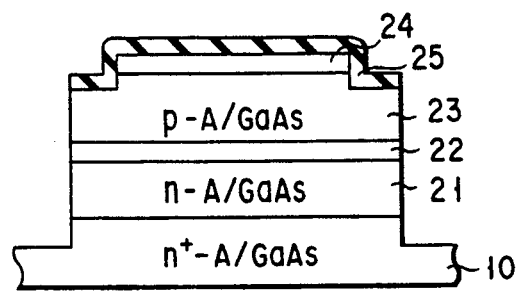
F I G. 4D
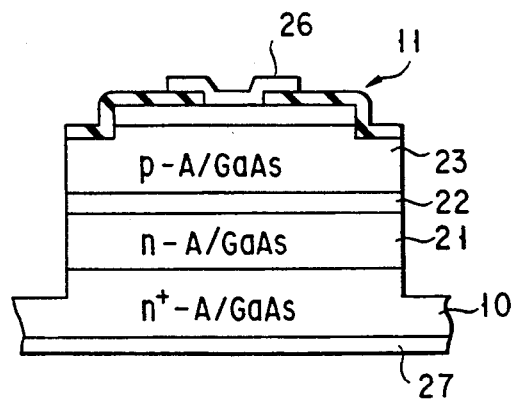
F I G. 4E

INTEGRATED OPTICAL DISPLACEMENT SENSOR

BACKGROUND OF THE INVENTION

1. Field of the Invention

The present invention relates to an integrated optical displacement sensor by use of laser beams, and more specifically, an apparatus for measuring a fine displacement of a sample.

2. Description of the Related Art

Generally, optical sensors which measure a displacement of a sample based on an optical interference method are most widely used because the wavelength of a light beam can be used as a reference in these sensors. In the optical interference method, a measurement laser beam irradiated on a sample, and a reference laser beam irradiated on a surface which is used as a reference, are interfered with each other to measure a displacement in accordance with the configuration (projection and recess) of the sample. Some examples of the method which do not operate based on the optical interference technique are an optical lever technique, utilizing the widening angle of an optical fiber.

For example, in the optical cantilever method, a laser beam output from a laser is made incident obliquely on a sample, and its reflection light beam is received by an optical detector such as a beam split sensor. Therefore, the position of the light beam incident spot detected by the optical detector moves in accordance with the displacement of a sample in the surface normal direction, or the variance of the tilting angle with respect to the incident light beam. Accordingly, the output of the optical detector varies, and based on this variance, the displacement of the sample can be measured.

In the case where a beam-split photodetector is used as the optical detector, the displacement of a sample can be measured by monitoring the value (error signal) obtained from the calculation formula $(A-B)/(A+B)$ where A and B are voltages output in accordance with the quantity of light made incident on of the respective sensors. The name, optical lever, is originated from cantilevers, which are samples to be measured. The displacement magnification m, which is an index of the sensitivity of the measurement of displacement, is proportional to L/l as below:

$$m \propto L/l \quad (1)$$

where L is a distance and between the cantilever and the optical detector, and l is a length of the cantilever.

In this conventional optical displacement measurement method, the longer the distance D between a sample the optical detector, and the larger is the displacement magnification m, as mentioned. Therefore, the longer the value L, the finer is the measurement of displacement. As a result, the size of the displacement measure inevitably becomes large.

The optical displacement sensor is applied to a measurement device such as an atomic force microscope (AFM). In this device, displacement of a cantilever which displaces in accordance with displacement of a sample is measured by the optical displacement sensor, and thus the displacement of the sample is indirectly measured.

The AFM has been proposed as a microscope for observing an insulating sample at an accuracy of atomic order by use of elemental techniques, including the servo technique, of the scanning tunnel microscope (STM) invented by Binning and Rohree et al. (U.S. Pat. No. 4,724,318: IBM, G. Binning, Device and Method of Forming the Image of the Surface of Sample). With the AFM, it is easy to observe an insulating sample, which is difficult to measure by conventional STMs.

The structure of an AFM is similar to that of an STM, and the AMF is regarded as a type of the scanning probe microscopes. According to the AFM, a cantilever having a sharply projecting free end (probe) is arranged such that the probe faces close to a sample, and movement of the cantilever caused by the interacting force between atoms located at the end of the probe and atoms of the sample, is electrically or optically measured. Further, while measuring the movement, the sample is scanned in the X, and Y directions to change the relative position of the sample with respect to the probe of the cantilever, and thus the three-dimensional configuration data of the sample can be obtained.

Such a high-resolution measuring device requires a highly sensitive displacement sensor to achieve a high resolution, and at the same time, the size of the device must be reduced to control mechanical vibration of the measuring device itself. However, the conventional techniques are not fully satisfactory as regards the above-mentioned points.

SUMMARY OF THE INVENTION

The present invention has been proposed to satisfy the requirements mentioned above, and the purpose thereof is to provide an integrated optical displacement sensor having a high measurement sensitivity, and which can achieve miniaturization of the whole device.

The integrated optical displacement sensor according to the present invention has a structure in which a laser, micro-lenses, and optical detector are integrated on the same substrate, and is characterized in that a laser beam generated from the laser is transmitted through a micro-lens onto the surface of a sample, and the light beam reflected on the sample is received by the optical detector. By monitoring the output from the optical detector, which varies in accordance with displacement of the sample, the displacement of the sample can be measured.

Onto the optical detector, the reflection light beam, which has the quantity of light corresponding to the displacement of the sample, is made incident. Therefore, by calculating the output from the sensor, the displacement of the sample can be measured.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 2 is a diagram showing a relationship between the optical detector and an incident laser beam in the integrated optical displacement sensor;

FIGS. 4A to 4E are diagrams illustrating an example of method of manufacturing the integrated displacement sensor;

DETAILED DESCRIPTION OF THE PREFERRED EMBODIMENTS

An embodiment of the invention will now be explained in detail with reference to FIG. 1.

Figure 1:
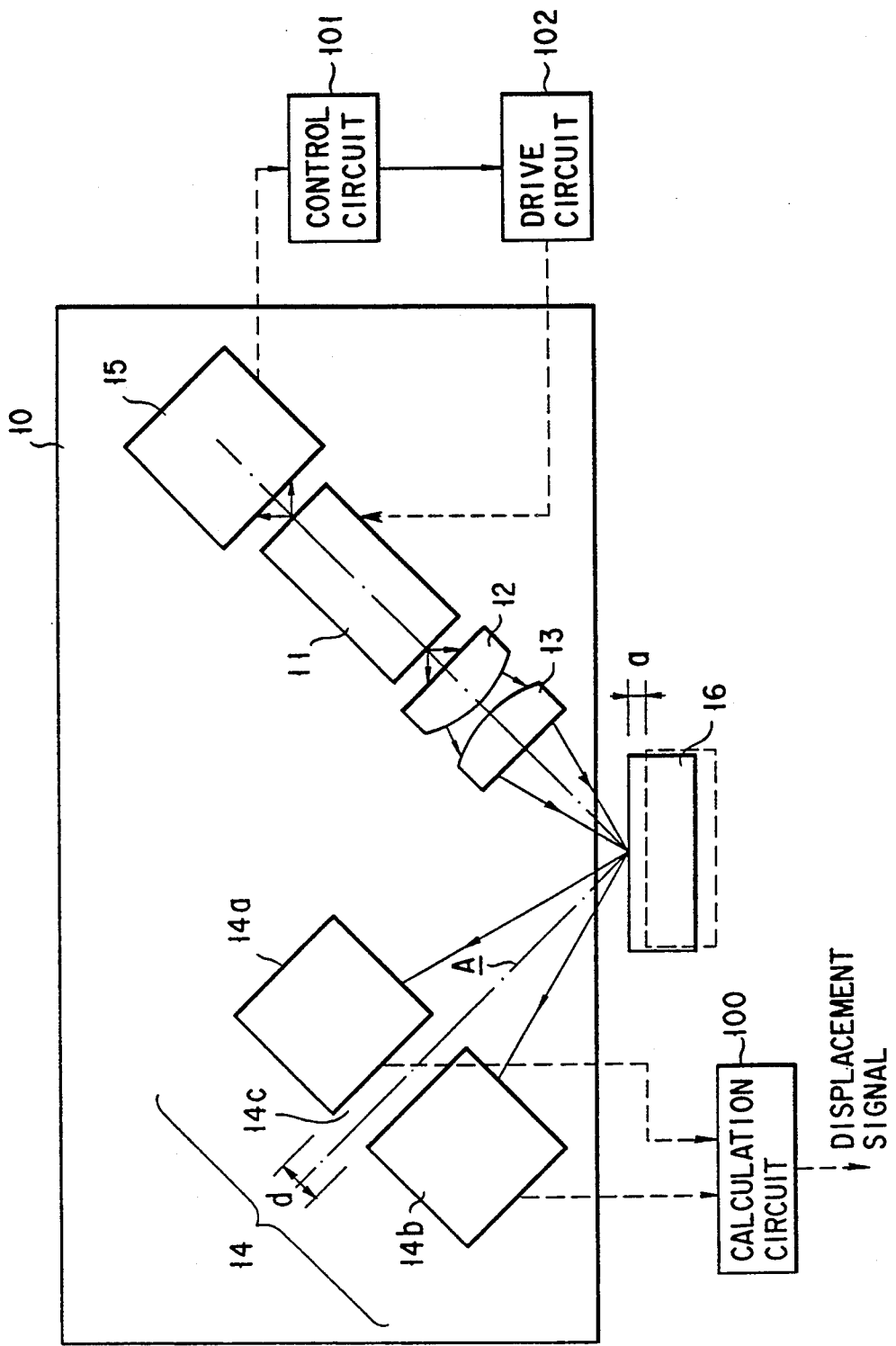
FIG. 1 is a side view of an integrated optical displacement sensor according to an embodiment of the present invention.

As can be seen in FIG. 1, on a surface of a semiconductor substrate 10, elements of the sensor, i.e., a semiconductor laser 11, two micro-lenses 12 and 13, and first and second semiconductor optical detectors 14 and 15 are arranged by an integration technique. To minimize the size of thus integrated elements, they are placed to satisfy the following structure. A laser beam output from one of the light beam exit of the semiconductor laser 11 is transmitted through the first and second micro-lenses 12 and 13, and focused on the measurement surface of a sample 16 provided at a certain distance away from the semiconductor substrate 10. The laser beam reflected on this measurement surface widens at a certain widening angle and is made incident on the first optical detector 14. The optical detector 14 consists of square or rectangular first and second detecting sections 14a and 14b, located apart from each other, with an insensitive section 14c having a certain width d therebetween, and the reflection light beam axis passes through the center of the insensitive section. The detecting sections 14a and 14b output electrical signals having the voltages of values A and B, respectively in accordance with the quantity of incident light, and the output terminal of each of the detecting sections is connected to a calculation circuit 100. The calculation circuit carries out a calculation based on the formula $(A-B)/(A+B)$, and outputs a displacement signal, which is the result of the calculation.

The second optical detector 15 supplies a signal having a value corresponding to the quantity of the light beam output from the other light beam exit of the semiconductor laser 11, to a control circuit 101, where the quantities of light beams output from the semiconductor laser 11 are equalized into a constant value at all times. In other words, the control circuit 101 serves as a monitor to carry out feedback for a drive circuit 102 of the laser 11.

In an integrated optical displacement sensor having the above-described structure, if the sample 16 is displaced from the reference position in the direction away from the substrate 10 by a distance a, as indicated by dot line, the reflection light beam from the sample 16 which is made incident on the optical detector 14 is displaced towards the second detecting section 14b, as indicated by incident light spot S in FIG. 2. The displacement of the sample may occurs, for example by variance of physical forces such as acceleration, interatomic force, pressure, electromagnetic force. Therefore, the quantity of light beam applied to the second detecting section 14b becomes larger than that applied to the first detecting section 14a. Consequently, the voltage B of the output signal from the second detecting section 14a becomes higher than the voltage A of the output signal from the first detecting section 14a. The calculation circuit 100 carries out the above-described calculation of values A and B, and thus the distance a which the sample is displaced is detected. As mentioned before, since the size of the whole device is small, and there is an insensitive section 14c having a certain width d between the detecting sections 14a and 14b, the difference between the quantities of light received by the first and second detecting sections 14a and 14b becomes more significant than the case where there is no insensitive portion, thereby enhancing the sensitivity of detection.

The following is an explanation of the relationship between the insensitive section 14c and the enhancement of the sensitivity.

Figure 3A:
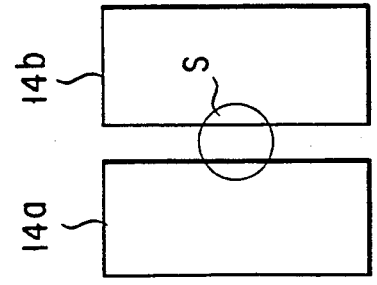
FIGS. 3A to 3C are diagrams each showing a relationship between an insensitive section of the optical detector, and an incident laser spot, in the integrated displacement sensor.
Figure 3B:
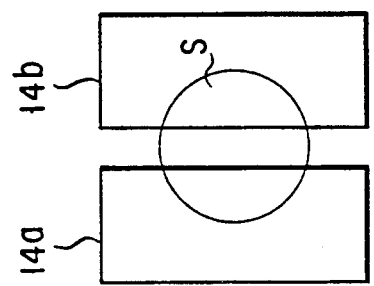
Figure 3C:
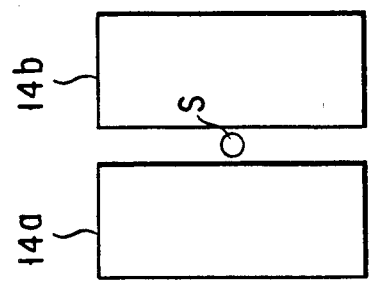

In the case where a concentrated laser beam is irradiated on the sample 16, the ratio between the area of the incident light spot S on the optical detector 14 and the area of the insensitive section 14c varies in accordance with distance L between the measured surface of the sample 16 and the light receiving surface of the optical detector 14. More specifically, the closer the optical detector 14 approaches the sample 16, the larger the area ratio becomes. Miniaturization of the device shortens the distance L, and therefore the area ratio increases. Accordingly, the difference (ratio) between the quantities of light received by the detecting sections 14a and 14b, caused by displacement of the incident light spot S, increases, and thus the sensitivity of the sensor is enhanced. FIGS. 3A to 3C show variations of the relationship between the incident light spot S and the optical detector 14 for different distances L while the width of the insensitive section 14c and the widening angle of the incident light irradiated on the optical detector 14 are fixed constant. As understood from these figures, the ratio of the area of the insensitive section 14c with respect to the area of the incident light spot S is larger in the case where the distance L is short (FIG. 3A than in the case where the distance L is long (FIG. 3B). However, if the distance L is too short, and the diameter of the incident light spot S becomes shorter than the width of the insensitive section 14c as shown in FIG. 3C, no output signals can be obtained from the optical detector 14 while the incident light spot S passes through the insensitive section 14c, and therefore the calculation cannot be carried out in this case. Thus, it is preferable that the distance L should not be so short that the diameter of an incident light spot S is smaller than the width of the insensitive section 14c.

The following is an explanation of an example of method of manufacturing a integrated optical displacement sensor having the above-described structure with reference to FIGS. 4A to 4E and FIGS. 5A and 5B. According to this method, a semiconductor laser 11, and two optical detectors 14 and 15 can be formed on an semiconductor substrate 10 in one step; therefore formation of the semiconductor laser 11 will be mainly discussed here with reference to FIGS. 4A to 4E. Meanwhile, formation of micro-lenses 12 and 13 on the semiconductor 10 will be also discussed with reference to FIGS. 5A and 5B.

First, an n+-conductive-type GaAs substrate is employed as the semiconductor substrate 10. On the upper surface of the substrate 10, an n-conductive-type AlGaAs layer 21, an activation layer 22, a p-conductive-type AlGaAs layer 23, and a p+-conductive-type AlGaAs layer 24 are deposited in the mentioned order by a molecular beam epitaxial method, to form a multi-layered member as shown in FIG. 4A. The activation layer 22 formed on the AlGaAs layer 21, includes an AlGaAs layer 22a, a GaAs layer 22b, an AlGaAs layer 22c, a GaAs layer 22d, and an AlGaAs layer 22e laminated one on the other in the mentioned order. The AlGaAs layers 22a and 22e contain less Al than the other AlGaAs layers in terms of component ratio. For example, if the components of the layers are expressed in the form of $Al_xGa_{1-x}As$, the AlGaAs layers 21 and 23 locating upper and lower sides of the activation layer 22, respectively, can have an x value of about 0.45, whereas an x value for the AlGaAs layer 22a of the activation layer 22 can be about 0.30. Next, by use of an ion beam etching technique, a part of the upper section of each of the AlGaAs layers 23 and 24 is selectively etched to form the AlGaAs layer 24 into an island-like shape as shown in FIG. 4C. Then, a part of the multi-layered member is etched along with the corresponding surface portion of the GaAs substrate 10 to divide into several pieces, and an $SiO_2$ film 25 is deposited on each of the pieces (in this embodiment, the multi-layered member is divided into 4 pieces, i.e., the semiconductor laser 11, the detecting sections 14a and 14b, and the optical detector 15, but only the semiconductor laser 11 is shown in FIG. 4D). Then, a slit-like opening is made in the $SiO_2$ film 25, and AuSn and Au are deposited on the section of the upper surface of the AlGaAs layer 24, which is exposed through the opening, to form a p-electrode 26. Further, TiPtAu and Au are deposited on the lower surface of the semiconductor substrate 10 to form an n-electrode 27, and thus the semiconductor laser 11 is completed. Though explanations thereof are omitted, the detecting sections 14a and 14b, and the optical detector 15 are also fabricated together with the semiconductor laser 11.

Figure 5A:
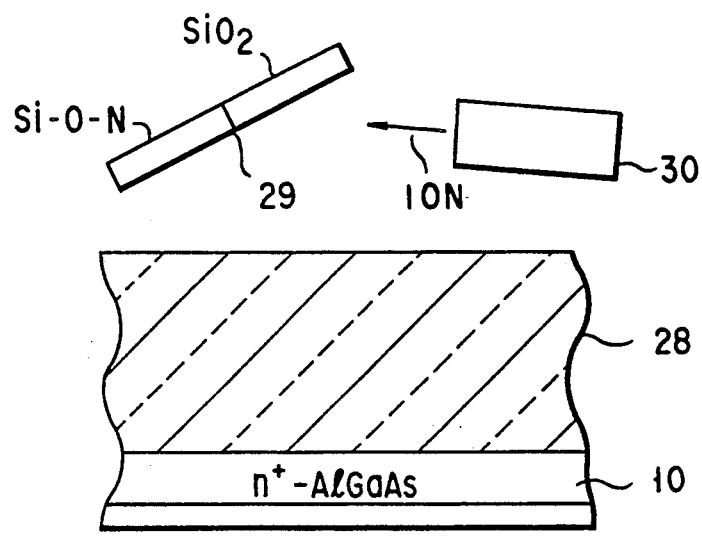
FIGS. 5A and 5B are diagrams illustrating an example of method of forming a micro-lense of the integrated displacement sensor.
Figure 5B:
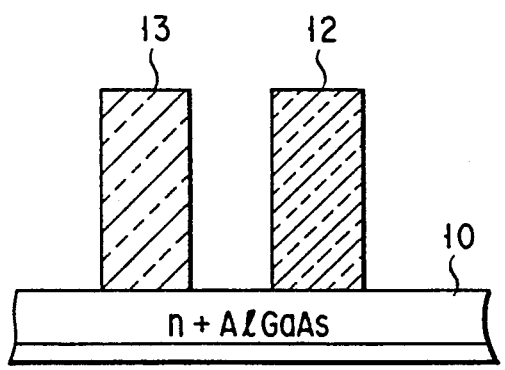

After that, a lens material layer 28 having a refractive index different from that of the semiconductor substrate 10 is formed on the substrate 10 in the thickness direction of the exposed surface, that is, the perpendicular direction. The lens material layer 28 may be formed by a spattering technique. In the spattering technique, a target 29 consisting of an $SiO_2$ material region and an Si—O—N material region is prepared, and ions generated from an ion source 30 are first irradiated on the Si—O—N material region, then on the $SiO_2$ region, and lastly, on the Si—O—N material region, again, as shown in FIG. 5A. Parts of the lens material layer 28 are selectively removed by a reactive ion beam etching, leaving two cylindrical sections having bent side surfaces facing with each other, which are later to be micro-lenses 12 and 13, as can be seen in FIG. 5B. The micro-lenses 12 and 13 thus formed serve a focusing function in which a light beam is concentrated into a point by use of change in the refractory index regarding the vertical direction, and the curved surface (curved around the axial line perpendicular to the upper surface of the substrate), regarding the horizontal direction.

Figure 6:
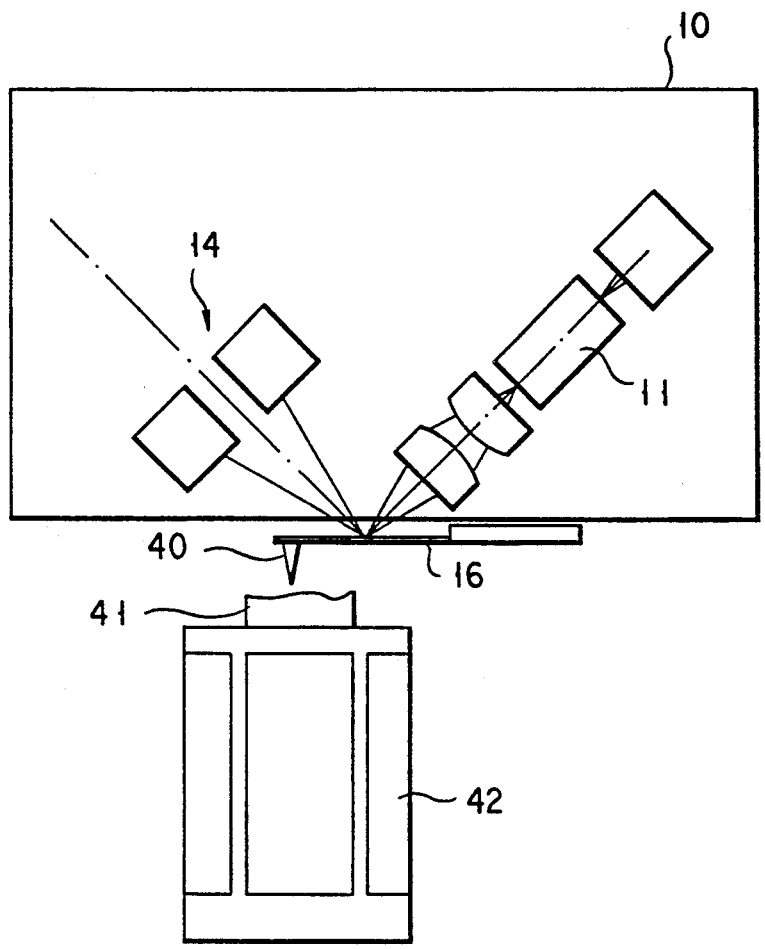
FIG. 6 is a side view of an AFM, to which the integrated optical displacement sensor according to the embodiment of the invention is installed.

The following is an explanation of an example where an integrated optical displacement sensor having the above-described structure is mounted to an atomic force microscope (AFM) with reference to FIG. 6.

In this example, a cantilever having the proximal end fixed to an end surface of a semiconductor substrate 10, and the free end located close to the end surface and having a probe 40 projecting downward is used as a sample 16, and displacement of the cantilever in the Z direction or vertical direction is detected by the integrated optical displacement sensor. Below the probe 40, a sample 41 to be measured is placed with an extremely small distance away from each other. The sample 41 is fixed to a piezo-tube scanner 42 which is movable in the X, Y, and Z directions.

Thus, when the sample 41 is scanned in the X and Y directions by the piezo-tube scanner 42, the cantilever is displaced in the Z direction according to the surface conditions of the sample due to the interatomic force acting between atoms of the sample 41 and atoms of the tip end of the probe 40. The displacement is detected by receiving the light beam reflected on the supper surface of the cantilever by use of the semiconductor laser 11 for irradiating the beam onto the cantilever and the optical detector 14 for receiving the reflection light beam.

In general, in order to lower the mechanical resonance frequency of an AFM device, and enhance the mechanical strength of the device against vibration, the size of the device should be reduced. An AFM device having the above-described integrated optical displacement sensor can be made much smaller than conventional devices, and thus the above purposes, i.e. lowering the mechanical resonance frequency and enhancement of the mechanical strength, can be achieved in this regard.

In the meantime, after the new technology was introduced by T. R. Albrecht et al., regarding $SiO_2$ cantilever chips fabricated through a semiconductor process (T. R. Albrecht, Calvin F. Quate: Atomic Resolution Imaging of a Nonconductor by Atomic Force Microscopy, J. Appl. Pys. 62 (1987) 2599), AFM cantilevers can be fabricated at a very high accuracy of an order of $\mu$m, with a high reproductivity, and if they are fabricated by a batch process, the production cost can be significantly reduced. Therefore, cantilever chips prepared by an applied technique of the semiconductor IC process are mainly used at present.

These cantilevers have lengths of tens of $\mu$m to several hundred $\mu$m, which are shorter than the conventional cantilever of aluminum foil. Accordingly, inclination of the cantilever, the sample, greatly changes, making the measurement of the optical lever type displacement sensor easy to carry out. In AFM devices employing such a cantilever, the integrated optical displacement sensor according to the present invention is even more significant.

Figure 7:
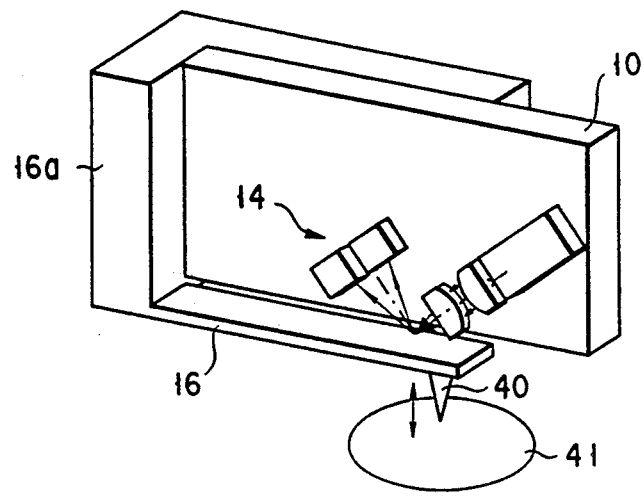
FIG. 7 is a schematic view of an example of the integrated optical displacement sensor according to the embodiment actually integrated with the cantilever of an AFM.

In the meantime, the cantilever fabricated through the semiconductor process, and the integrated optical displacement sensor according to the invention, are manufactured in a similar production process; therefore the cantilever and the sensor can be combined with each other. Thus, the size of such an AFM device can be further reduced. An example of this is illustrated in FIG. 7. In this example, an integrated optical displacement sensor and a cantilever 16 are prepared through different processes or made of different materials (or of the same material or of materials of the same kind). Then, the rear surface of the substrate 10 (the former) and a side surface of the supporter 16a (the latter) are adhered to each other such that the bottom surface of the substrate 10 is located very close to the upper surface of the cantilever 16. An end surface of the substrate 10 and the upper surface of the cantilever 16 are located in parallel with each other with a very small distance therebetween. The cantilever 16 should preferably be formed of the same material as the supporter 16a, and they should be integrated into one, though it is not essential. In this example, the substrate 10 is made of GaAs, whereas the supporter 16a is made of Si, and they are adhered to each other by adhesive into an assembly.

Figure 8:
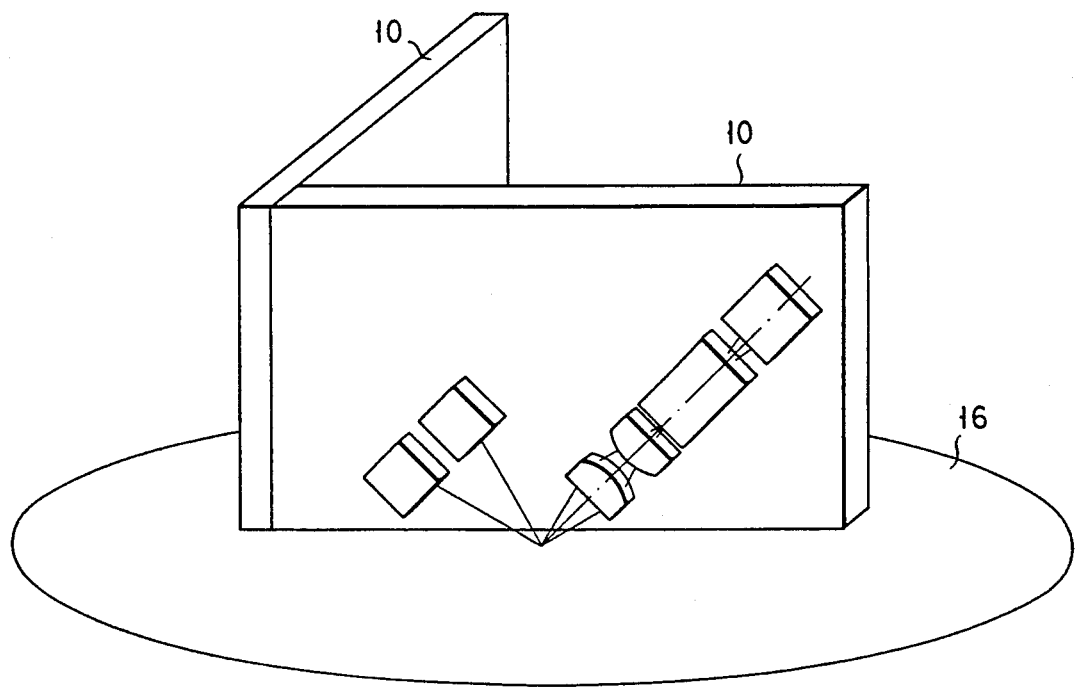
FIG. 8 is a schematic view of an example in which two of the displacement sensors according to the embodiment are used as a combination pair.

FIG. 8 illustrates another example in which two integrated optical displacement sensors are prepared, and substrates 10 of both are adhered to each other by their end portions at right angle. A device having such a structure is able to detect displacement of a sample 16 at two different places at the same time. Consequently, for example, twist and inclination of the sample 16 can be measured. According to the present invention, the integrated optical displacement sensor can be made small; therefore a plurality of such displacement sensors can be jointed into several combinations for a variety of use.

Figure 9:
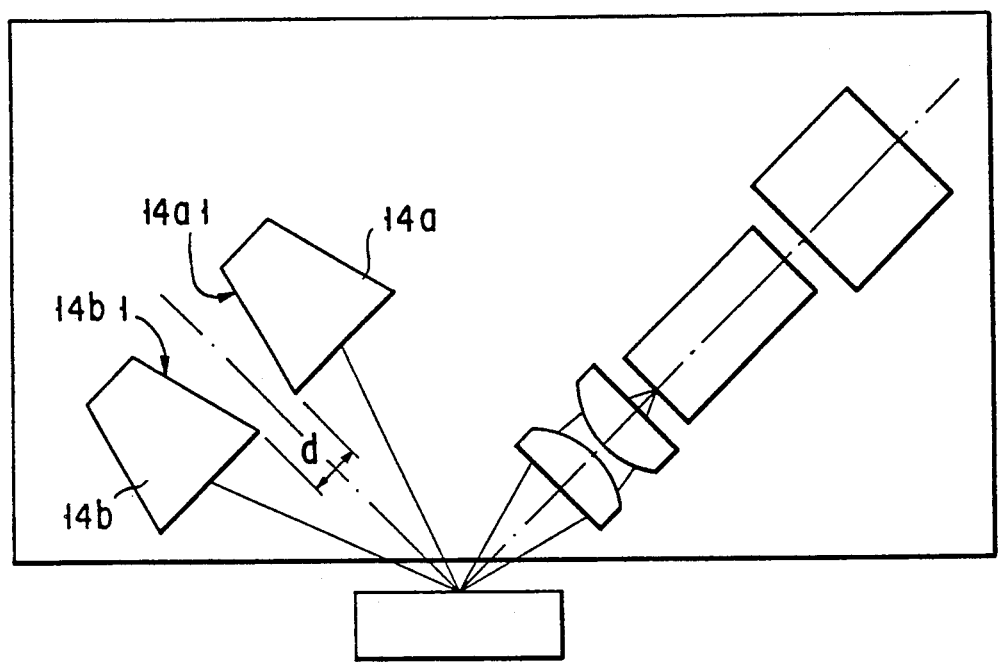
FIG. 9 is a side view of another version of the displacement sensor according to the embodiment of the invention.

In the above embodiment, the detecting sections 14a and 14b are formed into a rectangular shape, but the shape of the detecting sections is not limited to this. For example, the detecting sections may be quadrangles having sides 14$a_1$ and 14$b_1$ formed in such a manner that the distance between the sides becomes wider in the proceeding direction of the reflection light beam. In other words, as can be seen in FIG. 9, these sections may be trapezoids each having longer sides on the light receiving side. With this structure, suppressed is the influence of perplexed light such as diffraction light from the edges of the detecting sections 14a and 14b, which is made incident on the sides 14$a_1$ and 14$b_1$ of the detecting sections 14a and 14b. Thus, a displacement sensor having a high S/N ratio can be realized.

The integrated optical displacement sensor according to the invention is not limited to the structure of the embodiment described, or to the production method also described. For example, the substrate does not have to be made of GaAs, but may be of the material of other type of semiconductor, insulator, or the like. Further, the micro-lenses may be of other materials, or may be prepared by other techniques.

According to the present invention, a laser, micro-lenses, and an optical detector are integrated into one on a substrate; therefore the size of the whole device can be reduced. Accordingly, influence of external vibration becomes small, thereby enabling a high accuracy measurement. Even if the distance between the optical detector and a sample is made short, the sensor can be designed such that the sensitivity thereof is not deteriorated. Further, according to the invention, there is no need to carry out alignment of the optical axis of the parts.

Figure 10A:
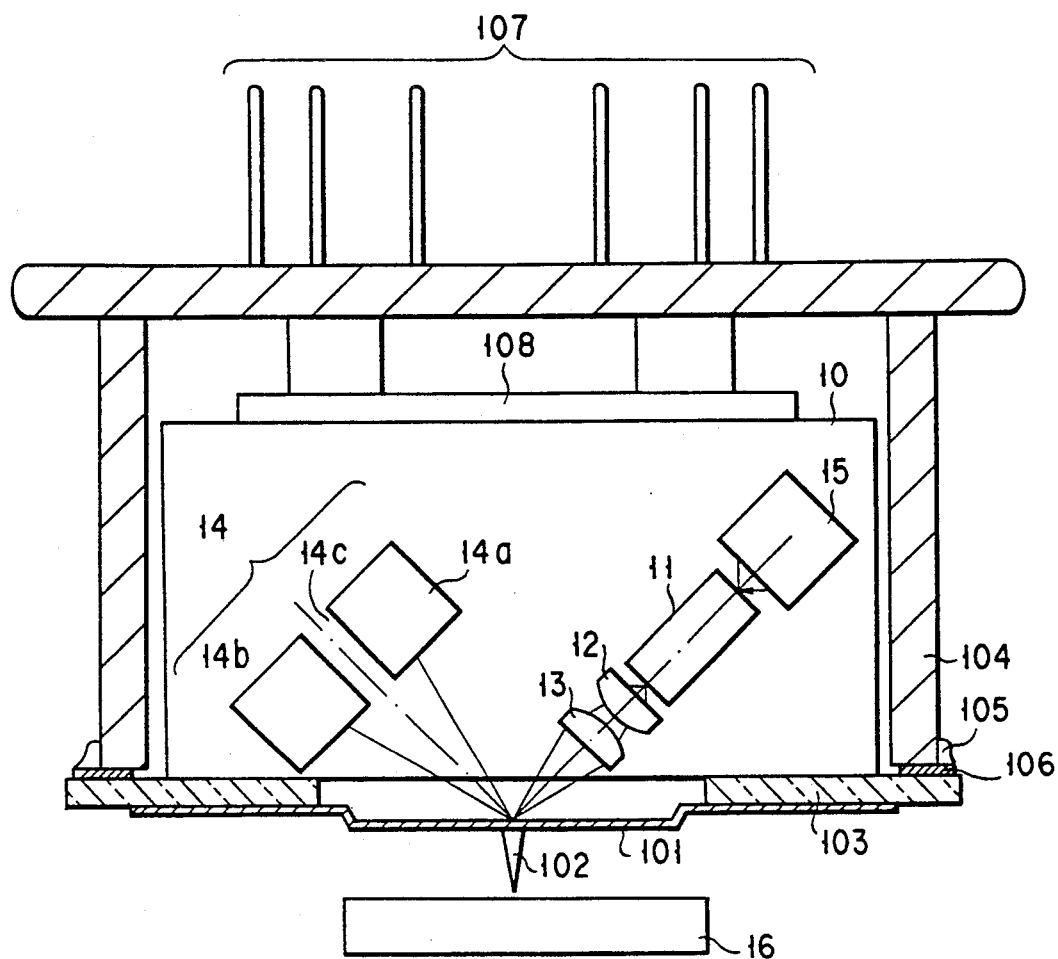
FIGS. 10A and 10B are a cross section and a schematic view, respectively, of another usage of the integrated optical displacement sensor according to the embodiment of the invention.
Figure 10B:
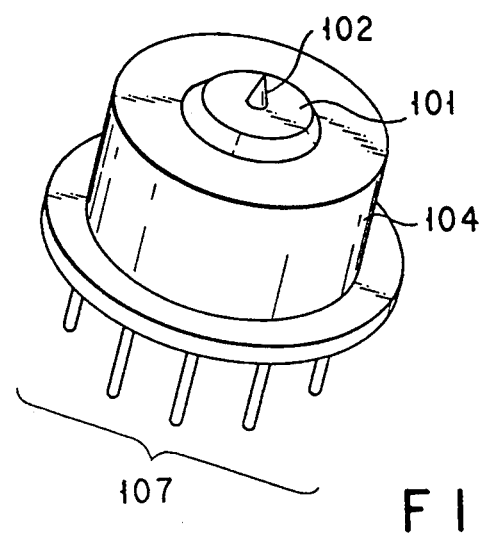

The following is an explanation of another embodiment with reference to FIGS. 10A and 10B.

In the case where a material of the GaAlAs group is employed to make a semiconductor laser, Al portion of the laser may be oxidized, and the performance of the laser may deteriorate. The problem of the oxidation can be solved by making the laser of a material of the InP group; however the InP laser can generate only infrared light (invisible light). This raises another problem of complicated setting of the incident point of the laser beam on a membrane, or complicated setting of the reflection light on the optical detector. To avoid this problem, in general semiconductor lasers, the GaAlAs laser chip is sealed in a package filled with nitrogen gas.

FIGS. 10A and 10B illustrate a structure of such a package.

A package 104 is of a can type having a cylindrical shape with an open lower end, and in this package, a metal plate 108 is fixed. On this metal plate 108, mounted is an integrated optical displacement sensor as shown in FIG. 1 by the upper end surface of the substrate 10. A glass circular plate 103 having a round opening at its center is mounted on the lower end opening of the package 104 such as to cover the lower end opening. In order to make mounting of the circular plate on the package smooth, the circumference of the upper surface of the circular plate 103 is coated with chrome coat 106 in advance. The lower end of the package is placed aligned onto the coat, and then the package is fixed to the plate by solder 105.

A membrane 101 is provided on the lower surface of the circular plate 103 such as to cover the center opening thereof. The membrane 101 is made of silicon oxide film, or silicon nitride film prepared by an anode oxidation technique, and formed very thin on the glass circular plate 103. A probe 102 is located at the position corresponding to the center axis of the membrane 10, that is, the center axis of the opening of the circular plate 103. The probe can be made by depositing some substance on the membrane, or etching the substrate into an integral form of the membrane and the probe. The membrane can reflect a laser beam by itself; however the incident surface for laser beams should preferably be coated with a reflective substance such as gold.

It should be noted that numeral 107 denotes a pin for taking out output signals from the detector 14.

In a package sealed integrated displacement sensor having the above-described structure, a sample is moved horizontally while the tip end of the probe 102 lightly touches the upper surface of the sample as shown in FIG. 10A. Thus, in accordance with the configuration of the upper surface of the sample 16, the probe 102 shifts up and down. Such shifting which occurs in accordance with the configuration of the sample, and the condition of the surface can be observed by detecting the reflection light from the membrane 101 by the detector 14.

In the example of usage of the invention shown in FIG. 10A, the integrated optical displacement sensor chip 100 is used as a probe displacement sensor for the AFM measurement by placing the probe 102 close to the sample 16, but the integrated optical displacement sensor 100 may be also used as an acceleration sensor by employing the membrane 101 as a membrane-type vibrator. In the case of the acceleration sensor, the designed resonance frequency thereof can be arbitrarily set by changing the area, thickness, and the like of the membrane 101.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An integrated optical displacement sensor for measuring a displacement of a sample, comprising:
   a substrate;
   laser means for generating a laser beam;
   focusing means for focusing the laser beam generated by the laser, on a surface of the sample;
   detecting means for detecting a reflection light reflected on the surface of the sample and for providing a detecting means output signal that varies in accordance with said displacement of the sample; and
   the laser means, the focusing means and the detecting means being integrated with the substrate to thereby form a unitary integrated structure.

2. The integrated optical displacement sensor according to claim 1, wherein:
   said laser means includes a laser formed on a material that is useable for forming semiconductor components thereon;
   said focusing means has at least one micro-lens formed on said material that is useable for forming semi-conductor components therein; and
   said detecting means has an optical detector formed on said material that is useable for forming semiconductor components thereon.

3. The integrated optical displacement sensor according to claim 2, wherein said optical detector is positioned close to the sample so that a diameter of an incident light spot of a light beam made incident on said optical detector is not less than a width of a non-detecting section provided on said optical detector.

4. The integrated optical displacement sensor according to claim 2, wherein:
   said at least one micro-lens has a refractive index that is distributed in a direction perpendicular to the substrate; and
   said at least one micro-lens has a side surface that is curved around an imaginary axis at a center of said distributed refractive index that is perpendicular to said substrate.

5. The integrated optical displacement sensor according to claim 2, wherein said optical detector has first and second detecting sections formed thereon that respectively have side surfaces that are positioned to face each other; and
   said side surfaces of said first and second detecting sections further being positioned to be tilted away from each other in a reflecting direction of a reflecting light beam.

6. As assembly including an integrated optical displacement sensor, a cantilever, and means for aligning the cantilever with respect to the sensor, said sensor comprising:
   a substrate having: a surface, an opposite surface, and side surfaces; and
   an integration on said surface, including:
   a laser for generating a laser beam;
   focusing means for focusing the laser beam generated by the laser on a surface of a cantilever; and
   detecting means for detecting a reflection light reflected on the surface of the cantilever and for providing an output signal which varies in accordance with a displacement of the cantilever;
   said cantilever comprising:
   a surface on which the laser beam is focused;
   an opposite surface, having a free end portion, and a fixed end portion; and
   a probe provided on the free end portions of said opposite surface; and
   said aligning means, for aligning said cantilever and said substrate so that a free end portion of at least said surface of said cantilever is positioned to be close to said substrate.

7. The assembly according to claim 6, wherein said aligning means includes a supporting member integrated with said cantilever, and said supporting member is connected to the opposite surface of the substrate.

8. An integrated optical displacement sensor for measuring a displacement of a sample, comprising:
   a pair of substrates arranged to cross each other at right angle; and
   an integrated body provided on each of said substrates, said integrated body including:
   a laser for generating a laser beam;
   focusing means for focusing the laser beam generated by the laser, on a surface of the sample; and
   detecting means for detecting a reflection light reflected on the surface of the sample and for obtaining an output signal which varies in accordance with said displacement of the sample.

9. An integrated optical displacement sensor according to claim 2, further comprising:
   housing means for housing the substrate therein, a part of said housing means comprising an elastic member; and
   a probe located on an outside portion of said housing means, a part of said housing means comprising said sample.

10. An integrated optical displacement sensor according to claim 9, wherein said part of said housing means comprising said sample includes said elastic member.

11. An integrated optical displacement sensor according to claim 10, wherein said elastic member comprises an elastic membrane.

12. An integrated optical displacement sensor according to claim 9, wherein said elastic member comprises an elastic membrane.

13. An integrated optical displacement sensor for measuring a displacement of a ample, comprising:
   a substrate;
   laser means for generating a laser beam;
   focusing means for focusing the laser beam generated by the laser, on a surface of the sample; and
   detecting means for detecting a reflection light reflected on the surface of the sample and for providing a detecting means output signal that varies in accordance with said displacement of the sample;
   the laser means, the focusing means and the detecting means being integrated with the substrate to thereby form a unitary integrated structure; and wherein:
   said laser means includes a laser formed on a material that is useable for forming semiconductor components thereon;

said focusing means has at least one micro-lens formed on said material that is useable for forming semi-conductor components thereon; and said detecting means has an optical detector formed of said material that is useable for forming semiconductor components thereon; and wherein:

said optical detector includes first and second detecting sections positioned on the substrate, said first and second detecting section being sensitive to an incident light;

a quantity of the reflection light incident on the detecting sections varying in accordance with the displacement of the sample; and a non-detecting section, that is not sensitive to the incident light, said non-detecting section having a given width, and said non-detecting section is positioned between the first and second detecting sections.

14. The integrated optical displacement sensor according to claim 13, wherein:

said at least one micro-lens has a refractive index that is distributed in a direction perpendicular to the substrate; and said at least one micro-lens has a side surface that is curved around an imaginary axis at a center of said distributed refractive index that is perpendicular to said substrate.

15. The integrated optical displacement sensor according to claim 14, wherein:

said first and second detecting sections respectively have side surfaces that are positioned to face each other; and said side surfaces of said first and second detecting sections further are positioned to be tilted away from each other in a reflecting direction of a reflecting light beam.

16. The integrated optical displacement sensor according to claim 13, wherein:

said first and second detecting sections respectively have side surfaces that are positioned to face each other; and said side surfaces of said first and second detecting sections further are positioned to be tilted away from each other in a reflecting direction of a reflecting light beam.

17. The integrated optical displacement sensor according to claim 13, wherein the at least one micro-lens formed on said material that is useable for forming semiconductor components thereon is one of SiO₂ and Si—O—N.

18. The integrated optical displacement sensor according to claim 13, wherein said optical detector is positioned close to the sample so that a diameter of an incident light spot of a light beam made incident on said optical detector is not less than a width of a non-detecting section provided on said optical detector.

19. An integrated optical displacement sensor for measuring a displacement of a sample, comprising:

a substrate;

laser means for generating a laser beam;

focusing means for focusing the laser beam generated by the laser, on a surface of the sample; and detecting means for detecting a reflection light reflected on the surface of the sample and for providing a detecting means output signal that varies in accordance with a displacement of the sample;

the laser means, the focusing means and the detecting means being integrated with the substrate to thereby form a unitary integrated structure;

housing means for housing the substrate therein, a part of said housing means comprising an elastic member; and a probe located on an outside portion of said housing means, a part of said housing means comprising said sample 20. The integrated optical displacement sensor according to claim 19, wherein at least one of the laser means, the focusing means, and the detecting means are formed on a layer formed of one of SiO₂ and Si—O—N.

21. An integrated optical displacement sensor according to claim 19, wherein said part of said housing means comprising said sample includes said elastic member.

22. An integrated optical displacement sensor according to claim 21, wherein said elastic member comprises an elastic membrane.

23. An integrated optical displacement sensor according to claim 19, wherein said elastic member comprises an elastic membrane.

24. The assembly according to claim 2, wherein the at least one micro-lens formed of said material that is useable for forming semiconductor components thereon is formed of one of SiO₂ and Si—O—N.

25. The assembly according to claim 6, wherein the focusing means are formed on a layer formed of one of SiO₂ and Si—O—N.

26. The assembly according to claim 8, wherein the focusing means are formed on a layer formed of one of SiO₂ and Si—O—N.

27. The assembly according to claim 9, wherein the focusing means are formed on a layer formed of one of SiO₂ and Si—O—N.

* * * * *